(12) United States Patent
Nepal et al.

(10) Patent No.: US 10,266,963 B2
(45) Date of Patent: Apr. 23, 2019

(54) GROWTH OF CRYSTALLINE MATERIALS ON TWO-DIMENSIONAL INERT MATERIALS

(71) Applicants: Neeraj Nepal, Woodbridge, VA (US); Virginia D. Wheeler, Alexandria, VA (US); Charles R. Eddy, Jr., Columbia, MD (US); Francis J. Kub, Arnold, MD (US); Travis J. Anderson, Alexandria, VA (US); Michael A. Mastro, Fairfax, VA (US); Rachael L. Myers-Ward, Springfield, VA (US); Sandra C. Hangarter, Gaithersburg, MD (US)

(72) Inventors: Neeraj Nepal, Woodbridge, VA (US); Virginia D. Wheeler, Alexandria, VA (US); Charles R. Eddy, Jr., Columbia, MD (US); Francis J. Kub, Arnold, MD (US); Travis J. Anderson, Alexandria, VA (US); Michael A. Mastro, Fairfax, VA (US); Rachael L. Myers-Ward, Springfield, VA (US); Sandra C. Hangarter, Gaithersburg, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 687 days.

(21) Appl. No.: 14/168,517

(22) Filed: Jan. 30, 2014

(65) Prior Publication Data
US 2014/0255705 A1    Sep. 11, 2014

Related U.S. Application Data

(60) Provisional application No. 61/774,769, filed on Mar. 8, 2013.

(51) Int. Cl.
B32B 9/00 (2006.01)
C30B 25/18 (2006.01)
(Continued)

(52) U.S. Cl.
CPC ........ *C30B 25/186* (2013.01); *C30B 25/183* (2013.01); *C30B 29/40* (2013.01); *C30B 29/406* (2013.01); *C30B 29/48* (2013.01)

(58) Field of Classification Search
CPC ............. Y10T 428/30; C01B 31/0438; C01B 2204/00; C23C 16/00
(Continued)

(56) References Cited

U.S. PATENT DOCUMENTS 7,282,738 B2 * 10/2007 Couillard ............... B82Y 30/00
  257/347
8,384,129 B2    2/2013 Kub et al.
(Continued)

FOREIGN PATENT DOCUMENTS

EP    20110808613    10/2013

OTHER PUBLICATIONS

Yi (WO 2012/057506) published Mar. 5, 2012; citations from nation stage application and US equivalent (US 2013/0213463).*
(Continued)

*Primary Examiner* — Daniel H Miller
(74) *Attorney, Agent, or Firm* — US Naval Research Laboratory; Stephen T. Hunnius

(57) ABSTRACT

A method of growing crystalline materials on two-dimensional inert materials comprising functionalizing a surface of a two-dimensional inert material, growing a nucleation layer on the functionalized surface, and growing a crystalline material. A crystalline material grown on a two-dimensional inert material made from the process comprising functionalizing a surface of a two-dimensional inert material, grow-
(Continued)

ing a nucleation layer on the functionalized surface, and growing a crystalline material.

4 Claims, 5 Drawing Sheets

(51) Int. Cl.
  *C30B 29/40* (2006.01)
  *C30B 29/48* (2006.01)

(58) Field of Classification Search
  USPC .............................. 428/408; 427/26; 423/448
  See application file for complete search history.

(56) References Cited

U.S. PATENT DOCUMENTS

| 2012/0068157 | A1 | 3/2012 | Kub et al. |
| 2012/0141799 | A1 | 6/2012 | Kub et al. |
| 2012/0235118 | A1* | 9/2012 | Avouris ............... H01L 29/518 257/27 |
| 2013/0017323 | A1 | 1/2013 | Garces |
| 2013/0213463 | A1* | 8/2013 | Yi ................... H01L 31/022425 136/255 |

OTHER PUBLICATIONS

A. Mazid Munshi, et. al. "Vertically Aligned GaAs Nanowires on Graphite and Few-Layer Graphene: Generic Model and Epitaxial Growth." Nano Letters, 2012, pp. 4570-4576, vol. 12, Issue 9.

Kunook Chung, et. al. "Transferable GaN Layers Grown on ZnO-Coated Graphene Layers for Optoelectronic Devices." Science, 2012, pp. 655-657, vol. 330.

Zang, K.Y. et al.; "Evolution of AlN buffer layers on silicon and effects on the properties of epitaxial GaN films"; physica status solidi (c) 7, 2003, pp. 2067-2071.

* cited by examiner

GROWTH OF CRYSTALLINE MATERIALS ON TWO-DIMENSIONAL INERT MATERIALS

REFERENCE TO RELATED APPLICATION

This application is a non-provisional of, and claims priority to and the benefits of, U.S. Provisional Patent Application No. 61/774,769 filed on Mar. 8, 2013, the entirety of which is hereby incorporated by reference.

BACKGROUND

The growth of materials directly on two-dimensional inert materials (2DIM), for example graphene, is challenging due to the lack of out-of-plane or dangling bonds on the surface to promote bonding with the foreign atoms.

As a result, we have employed various functionalization methods to modify the surface to promote bond formation during low temperature atomic layer deposition of high-k dielectrics on graphene and have resulted in pristine dielectric/graphene interfaces without altering the advantageous graphene electronic properties. The preferred method of functionalization is the chemisorption of an atom forming a semi-ionic bond to the 2DIM surface that preserves the structural and electrical integrity of the 2DIM, while providing sufficient nucleation sites for subsequent layer deposition. Fluorination, using xenon difluoride ($XeF_2$) gas, is one of the methods shown to functionalize the graphene surface with little degradation to the graphene lattice. In fact, an increase in mobility after the deposition of a thin oxide on fluorinated graphene with 6-7% of C—F bond has been shown. Similar approaches/arguments can be made for the whole family of 2DIMs.

High temperature growth of III-nitrides under conventional molecular beam epitaxy (MBE) or MOCVD conditions (500-1300° C.) directly on functionalized graphene would result in complete desorption of the semi-ionically bonded fluorine (or alternative) adatom and could hinder the advantage of fluorination, thus a low temperature albeit high quality growth of a III-N nucleation layer is important.

In order to preserve the essential fluorine functional groups, atomic layer epitaxy (ALE) is the preferred growth method as it enables growth of thin, uniform crystalline layers at low temperatures. The inherent kinetics of ALE, allow the growth of crystalline materials at greatly reduced temperatures relative to standard epitaxial techniques such as MOCVD.

In this disclosure we report on the first ever epitaxial growth of III-N semiconductor layers on graphene—a key enabler to a range of wide band gap-2D material heterojunction devices.

SUMMARY OF DISCLOSURE

Description

This disclosure pertains to a method for growing crystalline materials on inert two-dimensional materials including but not limited to graphene, hexagonal boron nitride, silicene, and grasene.

Using the method of invention we have been able to grow GaN epitaxially using an ALE grown AlN nucleation layer on graphene 2D materials. To our knowledge this is the first report on the epitaxial growth of any material directly on graphene.

We have employed various functionalization methods to modify the surface to promote bond formation during low temperature atomic layer deposition of high-k dielectrics on graphene and have resulted in pristine dielectric/graphene interfaces without altering the advantageous graphene electronic properties. The preferred method of functionalization is the chemisorption of an atom forming a semi-ionic bond to the 2DIM surface that preserves the structural and electrical integrity of the 2DIM, while providing sufficient nucleation sites for subsequent layer deposition.

Fluorination, using xenon difluoride ($XeF_2$) gas, is one of the methods shown to functionalize the graphene surface with little degradation to the graphene lattice. In fact, an increase in mobility after the deposition of a thin oxide on fluorinated graphene with 6-7% of C—F bond has been shown. Similar approaches/arguments can be made for the whole family of 2DIMs.

High temperature growth of III-nitrides under conventional molecular beam epitaxy (MBE) or MOCVD conditions (500-1300° C.) directly on functionalized graphene would result in complete desorption of the semi-ionically bonded fluorine (or alternative) adatom and could hinder the advantage of fluorination, thus a low temperature albeit high quality growth of a III-N nucleation layer is important.

In order to preserve the essential fluorine functional groups, atomic layer epitaxy (ALE) is the preferred growth method as it enables growth of thin, uniform crystalline layers at low temperatures. The inherent kinetics of ALE, allow the growth of crystalline materials at greatly reduced temperatures relative to standard epitaxial techniques such as MOCVD.

In this disclosure, we report on the first ever epitaxial growth of III-N semiconductor layers on graphene—a key enabler to a range of wide band gap-2D material heterojunction devices.

The epitaxial growth can be carried out in two steps. The first step is the 2D material surface preparation/functionalization. The surfaces of these films are prepared by ex-situ and/or in-situ pretreatments. Ex-situ pretreatment encompasses the treatment with various gas-phase chemistries ($XeF_2$), plasma (such as but not limited to $N_2$, $H_2$, $O_2$, $NH_3$, $NO_x$) and/or wet chemicals. In-situ pretreatment is with the plasma ($H_2$, $N_2$, mixture of $N_2$ and $H_2$, and/or ammonia or other appropriate gas). The appropriate surface pretreatment will be different depending on the nature of the crystalline material that is desired to be deposited on top of the 2DIMs. On pretreated surface the nucleation layers are grown via ALE. Finally, greater or equal to one monolayer crystalline materials (such as III-V, II-VI compound semiconductors) is grown upon the ALE film by conventional growth methods (for example MOCVD, MBE).

DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings.

DETAILED DESCRIPTION OF THE INVENTION

This disclosure pertains to a method for growing crystalline materials on inert 2D materials including but not limited to graphene, hexagonal boron nitride, silicene, and grasene.

Using the method of invention we have been able to grow GaN epitaxially using an ALE grown AlN nucleation layer on graphene 2D materials. To our knowledge this is the first report on the epitaxial growth of any material directly on graphene.

The epitaxial growth can be carried out in two steps. The first step is the 2D material surface preparation/functionalization. The surfaces of these films are prepared by ex-situ and/or in-situ pretreatments. Ex-situ pretreatment encompasses the treatment with various gas-phase chemistries ($XeF_2$), plasma (such as but not limited to $N_2$, $H_2$, $O_2$, $NH_3$, $NO_x$) and/or wet chemicals. In-situ pretreatment is with the plasma ($H_2$, $N_2$, mixture of $N_2$ and $H_2$, and/or ammonia or other appropriate gas). The appropriate surface pretreatment will be different depending on the nature of the crystalline material that is desired to be deposited on top of the 2DIMs. On pretreated surface the nucleation layers are grown via ALE. Finally, greater or equal to one monolayer crystalline materials (such as III-V, II-VI compound semiconductors) is grown upon the ALE film by conventional growth methods (for example MOCVD, MBE).

Example 1

As shown in the layer structure of FIG. 2(a), crystalline materials, for example thin AlN and GaN layers, were grown on 2DIM, for example graphene.

The starting pristine graphene was about 4-5 layers thick and it follows the surface morphology of the underlying SiC, with step edges and terraces as shown in AFM and SEM images in FIGS. 2(b) and (e), respectively. At optimized ALE growth conditions, AlN is deposited uniformly on graphene; AFM and SEM images of 1.2 nm AlN on $XeF_2$ functionalized graphene in FIGS. 2(c) and (f) show uniform nucleation.

FIGS. 2(d) and (g) show AFM and SEM images of epitaxial GaN on graphene using a 11 nm ALE AlN as a nucleation layer. In FIG. 2(h) we propose that the AlN lattice alignment along the m-plane to fluorinated graphene replacing a semi-ionically bound F atom by an Al atom without damaging the graphene lattice. The lattice mismatch between graphene and AlN is 4.5%, which is significantly smaller than the 13% between AlN and sapphire (which is the most commonly used substrate for III-nitride growth). This should lead to less defects forming during heteroepitaxial growth of thin layers. After targeted 800 nm of MOCVD GaN growth on the thin ALE AlN nucleation layer, step edges and terraces are still clearly visible, as shown in FIG. 2(d), which suggests uniform two dimensional (2D) growth of GaN. The few particles seen on the surface may be due to island nucleation.

Additionally, the SEM image in FIG. 2(g) suggests a uniform and almost pin-hole free surface morphology of the GaN on graphene over large areas that would be required to achieve higher device yields.

Figure 1:
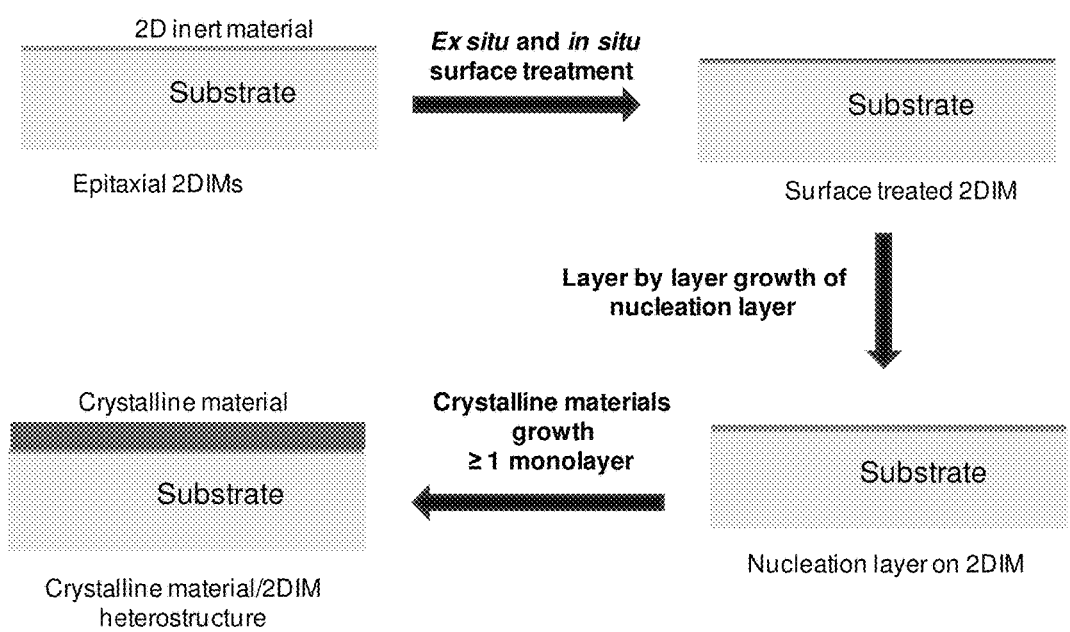
FIG. 1: Illustration of an example of process flow of crystalline materials growth on two-dimensional inert materials.
Figure 2:
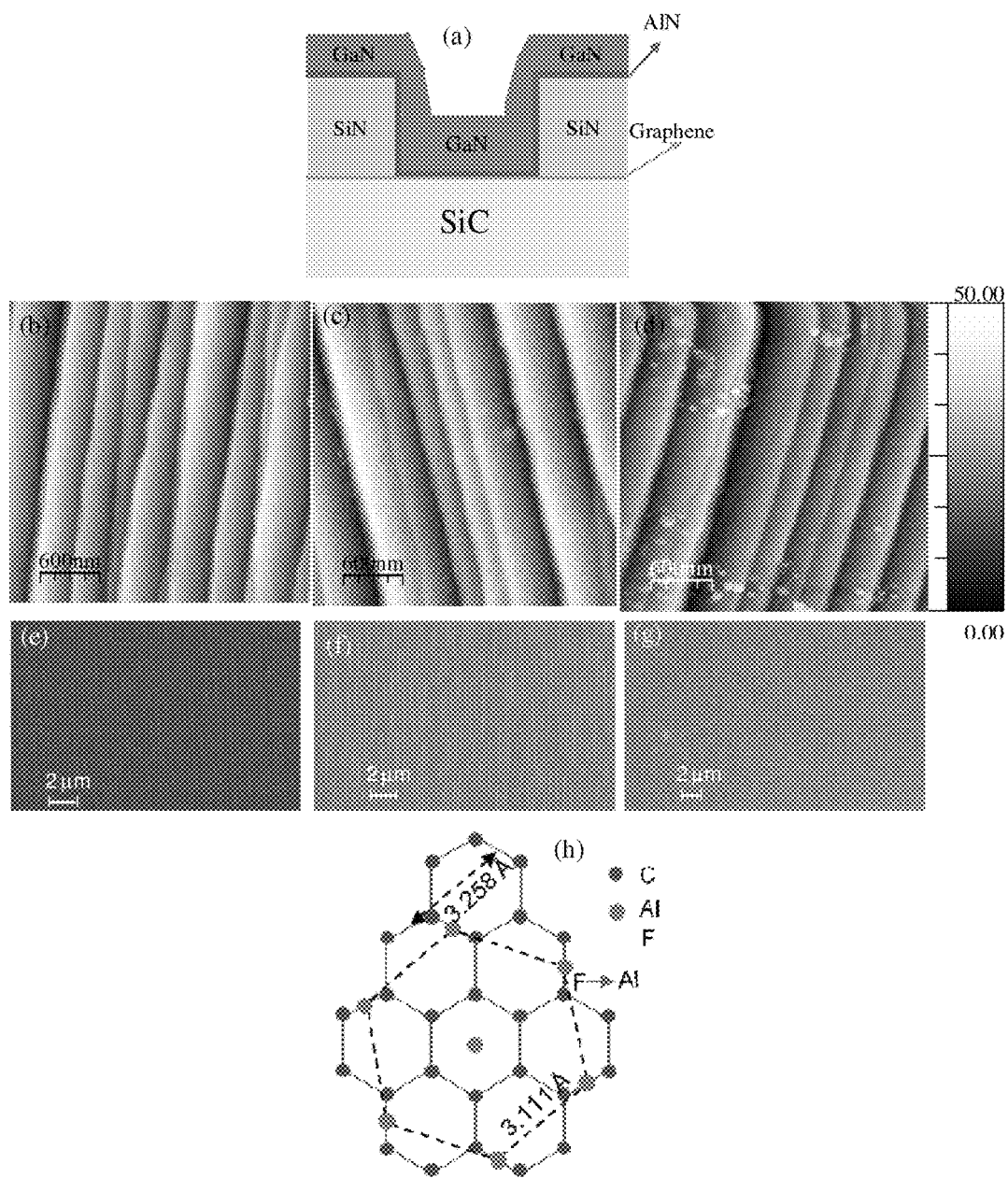
FIG. 2: (a) Schematic showing the GaN/AlN/graphene/SiC layered structure, (b) as synthesized epitaxial graphene AFM image, (c) AFM image of 1.2 nm ALE AlN/graphene, (d) AFM image of GaN/graphene, (e) SEM image of pristine graphene, (f) SEM image of 1.2 nm ALE AlN/graphene, (g) SEM image of GaN on AlE AlN/graphene, (h) Al atoms replace F atoms creating an AlN nucleation site on graphene resulting in the proposed crystalline alignments. The proposed lattice mismatch between AlN and graphene is 4.5%.

To assess if the underlining graphene remains intact beneath the GaN, Raman spectra were taken on the final structure (GaN/AlN/graphene/SiC) and shown in FIG. 2. As the GaN is relatively transparent to the pump wavelength, when the laser was focused on the underlying graphene, the 2D peak at 2719 $cm^{-1}$ is clearly visible demonstrating that, although the GaN growth process involved several different graphene surface processing steps and elevated temperature processing, the graphene layer was preserved. This confirms that the AlN and GaN growth occurred on the graphene surface and not on the SiC substrate. When the laser is focused on the SiC, the graphene peak disappears. There is no clear GaN peak, as it may be buried under the SiC background Raman signal.

Figure 3:
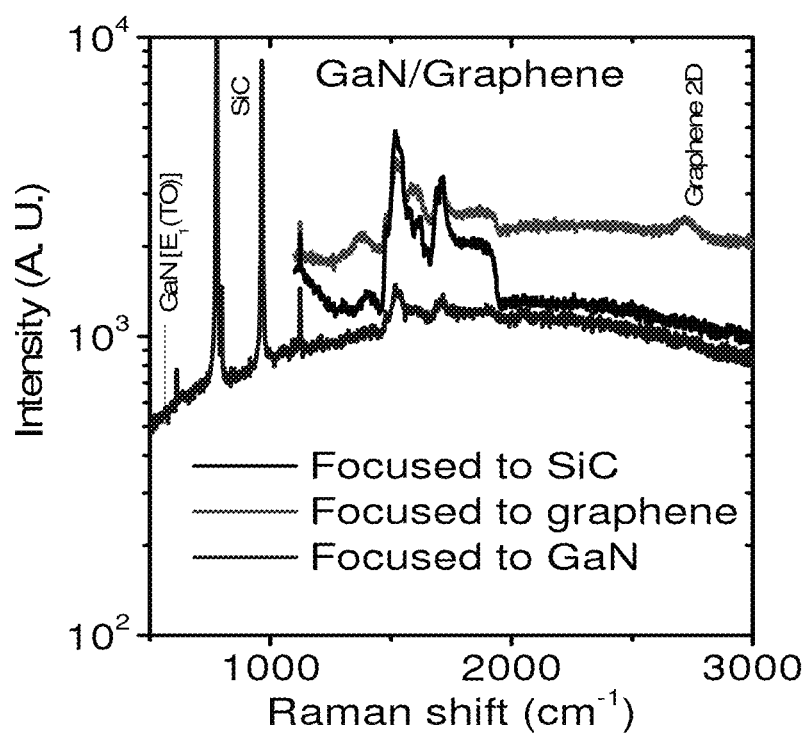
FIG. 3: Illustrates Raman spectra of GaN/AlN/graphene/SiC stack when the laser was focused within (a) SiC (black line) (b) graphene (red line) (c) GaN (blue line). Note the graphene 2D peak at 2719 $cm^{-1}$ for (c).

The crystalline quality and orientation of the GaN on graphene was assessed using XRD. FIG. 3 shows the XRD peaks from the GaN/AlN/graphene/SiC sample. A strong intensity from SiC is clearly visible.

Additionally, there are a set of peaks that are indexed to first and second order reflections of GaN (0002). The position of the GaN peaks confirms that the GaN on graphene has a wurtzite structure and is epitaxial in nature.

The XRD rocking curve of GaN (0002) and (0004) peaks are shown in the insets of FIG. 3. The rocking curve full with at half maximum (FWHM) of the (0002) and (0004) peaks are 544 and 461 arc-sec, respectively. These values are similar to typical rocking curve values for a 5 µm thick GaN grown on sapphire substrates which have a lattice mismatch of 16%. The similarity of these values of FWHM for an order of magnitude thinner GaN film may indicate that better crystalline quality material on graphene can be achieved.

A thin aluminum nitride (AlN) nucleation layer was grown on functionalized epitaxial graphene (EG) using atomic layer epitaxy (ALE). This thin nucleation layer enabled subsequent growth of a thick gallium nitride (GaN) film by metalorganic chemical vapor deposition (MOCVD).

The surface morphology of these GaN/AlN/graphene layers reveals smooth and uniform surface with steps and terraces, typical of the underlying silicon carbide substrate after EG growth. Raman measurements show a graphene 2D peak at 2719 $cm^{-1}$ after GaN growth, confirming preservation of the graphene after the ALE AlN and MOCVD GaN growth process. X-ray diffraction analysis reveals [0001] oriented hexagonal GaN with a rocking curve full width at half maximum (FWHM) of (0002) and (0004) peaks of 544 and 641 arc-sec, respectively. The FWHM values are similar to values of the same peaks observed for GaN grown by MOCVD on sapphire. The GaN layer has a strong room temperature photoluminescence band edge emission at 3.40 eV due to near band edge transition implies the epitaxial layer has good optical quality GaN layer on graphene. Successful demonstration of GaN growth on graphene opens up the possibility of III-nitride/graphene heterostructure-based electronic devices and promises improved performance.

For high-speed current switching applications, hot-electron transistors (HET) are superior to all other types of devices with cut-off frequencies greater than 1 THz. The typical state-of-art HET base layer consists of either a heavily doped semiconductor or metal. In HETs with a heavily doped semiconductor base, the ballistic or quasi-ballistic transportation of hot-electrons is inhibited by impurity and carrier-carrier scattering.

Whereas for HETs with a metal base, the quantum mechanical reflection at the interface between metal and semiconductor partially prevents a hot-electron from being transmitted to the collector region, which limits the device performance. Clearly it is desirable to replace the typical base layer with a material that does not suffer from the above problems.

Here, we propose replacing the base layer with graphene since it should overcome the limitations noted above and enable cut-off frequencies in excess of 1 THz. Further, we demonstrate that III-V HET structures can be epitaxially grown on a graphene base using a graphene fluorine-functionalization approach that does not appreciably disrupt the graphene lattice.

We further show, for the first time, that the resulting quality of the III-V nitride layers is similar to that obtained by traditional growth methods on traditional III-V nitride substrates.

Previously, Knook et al., grew GaN on oxygen plasma treated graphene, which resulted in a polycrystalline GaN layer with a rough and irregular surface. Additionally, they explored the use of vertically-aligned ZnO nanowalls as an intermediate layer on oxygen plasma treated graphene to grow GaN-based LEDs. The oxidized graphene and complex semiconductor interface of such an approach are certain to present significant trap centers for carriers, and hence degrade performance of the heterojunction.

Thus, the ability to grow semiconductor quality III-nitrides directly on the graphene with minimal interface defects is essential for such applications.

Although several efforts to deposit high-K dielectrics on graphene, the successful growth of high-quality III-nitride film on graphene has not been reported yet. Yet, there is information regarding the band line up for this system through the work of Zhong et al., who studied the electrical behavior of exfoliated graphene on n- and p-type GaN films. They reported that the single layer graphene adapts its Fermi level toward the semiconductor's Fermi level, which results in reduced barrier heights between graphene and both n- and p-type GaN.

The growth of III-nitrides directly on graphene is challenging as there are no dangling bonds on the surface of graphene to promote bonding with foreign atoms. As a result, we have employed various functionalization methods to modify the graphene surface to promote bond formation and create pristine dielectric/graphene interfaces without altering the advantageous graphene electronic properties.

Fluorination, using xenon difluoride ($XeF_2$) gas at room temperature, is one of the methods reported to functionalize the epitaxial graphene surface for enhanced dielectric deposition, which when optimized shows little to no degradation to the graphene lattice as measured by electronic transport.

In fact, an increase in graphene carrier mobility after the deposition of a thin high-κ oxide on fluorinated graphene using an optimal 6-7% areal percentage of C—F bonding has been shown.

The chemisorption of a fluorine atom forming a unique semi-ionic C—F bond rather than covalent bond to the graphene surface allows the structural and electrical integrity of the graphene to be preserved, while providing sufficient nucleation sites for subsequent high-quality layer deposition. Thus, fluorination via $XeF_2$ is the preferred functionalization method employed in this work.

High temperature growth of III-nitride under conventional molecular beam epitaxy (MBE) or MOCVD conditions (500-1300° C.) directly on functionalized graphene can result in complete desorption of the fluorine adatom and could hinder the advantage of fluorination, thus a low temperature albeit high quality growth of a III-N nucleation layer is important.

Atomic layer epitaxy (ALE) enables growth of thin, uniform layers at low temperatures needed to preserve the essential fluorine functional groups.

The inherent kinetics of ALE allow the growth of crystalline materials at greatly reduced temperatures relative to standard epitaxial techniques such as MOCVD. In this work we report on the first ever epitaxial growth of III-N semiconductor layers on epitaxial graphene (EG) by using $XeF_2$ functionalization followed by an ALE III-N buffer layer; as is shown, this is a key enabler to a range of new heterojunction devices.

Example 2

EG was grown on 4° 4H—SiC (16×16 mm$^2$) samples using the Si sublimation method. The synthesized EG layers were characterized using atomic force microscopy (AFM), LEO supra 55 scanning electron microscopy (SEM), Thermo Scientific K-Alpha x-ray photo electron spectroscopy (XPS), and room temperature Raman and photoluminescence measurements.

The Raman characterization was performed using an InVia Raman microscope (Renishaw) equipped with a 50× objective lens, a 514.5 nm diode laser excitation, at a set power of 20 mW at the source with a spot size of 5 μm.

Following initial characterization, the EG/SiC was patterned with $SiN_x$ deposited by plasma-enhanced chemical vapor deposition using standard photolithography and liftoff techniques. The patterned EG was functionalized using six, 30-second pulses of a $XeF_2$ plasma to form about 6-7% of "semi-ionic" C—F bonds.

The selectively functionalized graphene was then inserted into a Fiji ALE reactor (Cambridge NanoTech, Inc.) heated resistively at 280° C. for the growth AlN nucleation layer approximately 11 nm thick.

A Si(111) witness sample was used to monitor the growth rate. After pumping the reactor to its base vacuum of 166 mTorr, five pulses of 99.999% pure trimethylaluminum (TMA, ~1 Torr) (from Stream Chemicals Inc.) were introduced into the reactor to promote reaction of the TMA molecule with fluorine sites on the EG surface, presumably creating more nucleation sites for AlN growth.

The ALE growth of AlN was carried out in an Ar ambient. Each ALE cycle consisted of first a 60 ms TMA pulse. The TMA was added to 30 sccm flow of ultrahigh purity (UHP) Ar carrier gas via the metalorganic precursor line while 100 sccm of UHP Ar was introduced separately through the plasma source. For 30/100 sccm flow of UHP Ar, the reactor pressure was at 166 mTorr. Unreacted TMA precursor and by-products were removed by purging the chamber with UHP Ar for 10 sec.

A 15 s long, 150 W UHP $N_2$ plasma pulse was used as a nitrogen precursor. To remove unreacted nitrogen precursors and by-products, the deposition chamber was purged again with UHP Ar for 10 s.

The complete AlN growth consisted of 150 cycles, resulting in an AlN thickness of 11 nm on the Si witness sample as measured with spectroscopic ellipsometry.

An AFM operating in tapping mode was used to verify the uniformity of the AlN.

After characterization of the ALE grown AlN/EG, the sample was transferred into a MOCVD reactor. Unintentionally doped GaN of targeted thickness of 800 nm was grown in a heavily modified vertical impinging flow MOCVD reactor (CVD, Inc.) with a rotating susceptor.

Chemical bonding within the GaN/AlN/graphene/SiC stack (GaN/graphene) was characterized by x-ray photoelectron spectroscopy (XPS) using a monochromatic Al ($K_\alpha$=1486.6 eV) source and spot size of 0.4 mm. Raman spectra were acquired using an argon laser (514.5 nm) with 5 μm spot size as an excitation source on the final structure. The crystalline quality was characterized using double crystal X-ray diffractometer.

Photoluminescence (PL) measurement was carried out using HeCd laser at 325 nm, 1800 gr/mm double grating spectrometer, fitted with an UV sensitive photomultiplier tube.

Several initial attempts were made to grow MOCVD GaN directly on unfunctionalized EG, which always resulted in a non-uniform distribution of individual GaN crystallites instead of a continuous film. Based on previous work, we suggest that using fluorination with $XeF_2$ significantly increases the density of nucleation sites which subsequently promotes uniform, epitaxial growth.

To ensure that such functionalization survives to promote nucleation, a low temperature epitaxial growth processes is required at least at the beginning of the heteroepitaxy process, which in this case is the ALE of AlN. Therefore, our approach uses a fluorine functionalized EG surface to enable a thin ALE AlN buffer layer for subsequent thick GaN growth.

As shown in the layer structure of FIG. 2(a), thin AlN and GaN layers have been grown on both graphene and the adjacent $SiN_x$ mask. The starting pristine graphene was about 4-5 layers thick and it follows the surface morphology of the underlying SiC, with step edges and terraces as shown in AFM and SEM images in FIGS. 2(b) and (e), respectively.

At optimized ALE growth conditions, AlN is deposited uniformly on EG; AFM and SEM images of 1.2 nm AlN on $XeF_2$ functionalized EG in FIGS. 2(c) and (f) show uniform nucleation. FIGS. 2(d) and (g) show AFM and SEM images of epitaxial GaN on EG using a 11 nm ALE AlN as a nucleation layer.

In FIG. 2(h) we show the AlN lattice alignment along m-plane to fluorinated graphene replacing a semi-ionically bound F atom by an Al atom without damaging the graphene lattice. The lattice mismatch between graphene and AlN is 4.5%, which is significantly smaller than the 13% between AlN and sapphire (which is the most commonly used substrate for III-nitride growth), and leads to less defects forming during heteroepitaxial growth of thin layers.

After targeted 800 nm of MOCVD GaN growth on the thin ALE AlN nucleation layer, step edges and terraces are still clearly visible as shown in FIG. 2(d), which suggests uniform two dimensional (2D) growth of GaN. The few particles seen on the surface may be due to island nucleation. Additionally, the SEM image in FIG. 2(g) suggests a uniform and almost pin-hole free surface morphology of the GaN on graphene over large areas that would be required to achieve higher device yields.

To assess if is the graphene remains underneath the GaN, Raman spectra were taken on the final structure (GaN/AlN/graphene/SiC) and shown in FIG. 3. As the GaN is relatively transparent to the pump wavelength, when the laser was focused on the underlying graphene, the 2D peak at 2719 $cm^{-1}$ is clearly visible implying that, although the GaN growth process involved several different graphene surface processing steps, the graphene layer was preserved. This confirms that the AlN and GaN growth was on graphene not on the SiC. When the laser is focused on the SiC, the graphene peak disappears. There is no clear GaN peak, as it may be buried under the SiC background Raman signal.

Figure 4:
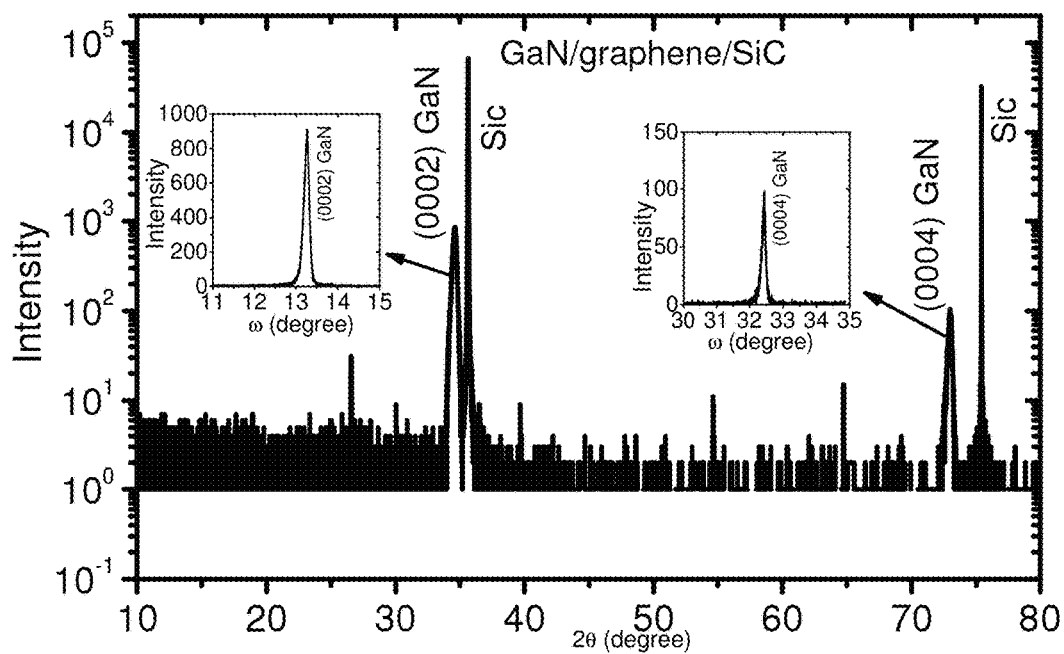
FIG. 4: XRD peaks from the GaN/AlN/graphene/SiC stack. Insets show the rocking curve of GaN (0002) and (0004) reflections. Rocking curve FHWM values of (0002) and (0004) peaks are 544 and 461 arcsec, respectively.

The crystalline quality and orientation of the GaN on EG was assessed using XRD. FIG. 4 shows the XRD peaks from the GaN/AlN/graphene/SiC sample. Strong intensity from SiC is clearly visible. Additionally, there are a set of peaks that are indexed to first and second order reflections of GaN (0002). The position of the GaN peaks confirms that the GaN on graphene has a wurtzite structure and is epitaxial in nature. The XRD rocking curve of GaN (0002) and (0004) peaks are shown in the insets of FIG. 3. The rocking curve full with at half maximum (FWHM) of the (0002) and (0004) peaks are 544 and 461 arcsec, respectively. These values are similar to typical rocking curve values for a 5 μm thick GaN grown on sapphire substrates which have a lattice mismatch of 16%. The similarity of these values of FWHM for an order of magnitude thinner GaN film may indicate that better crystalline quality material on EG can be achieved.

Figure 5:
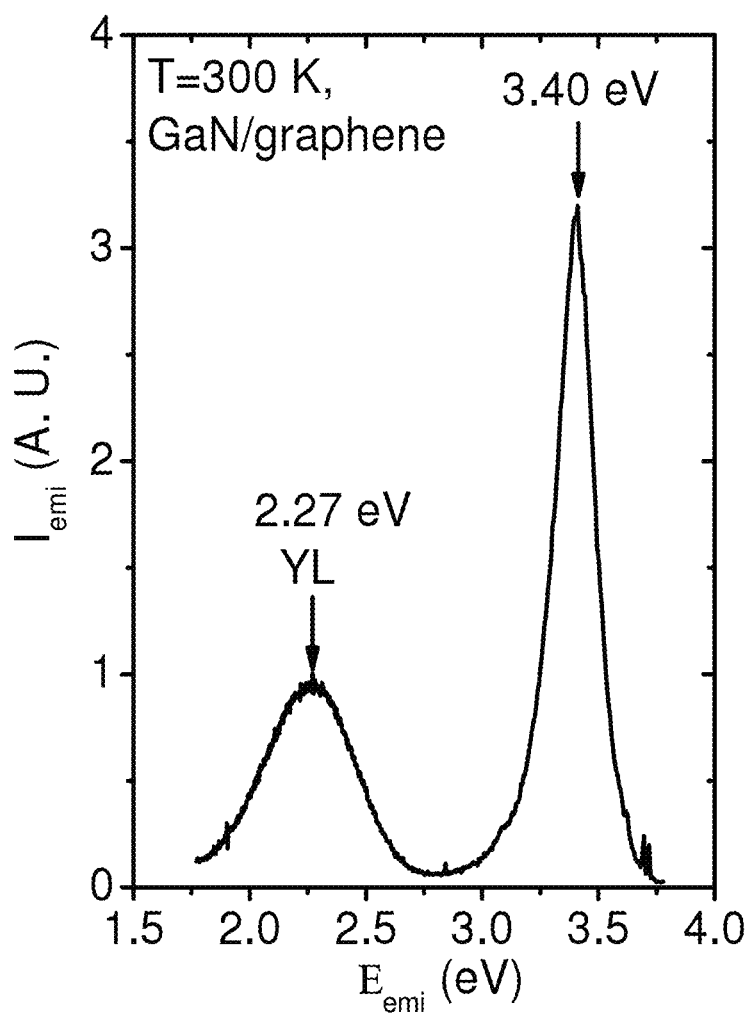
FIG. 5: Illustrates room temperature photoluminescence spectra of GaN on AlN/graphene/SiC stack. The near band edge (NBE) emission is at 3.40 eV, and there is a broad yellow line at 2.27 eV due to the presence of a Ga vacancy and oxygen complex point defect.

FIG. 5 shows room temperature PL spectra of the GaN on EG. There is clearly a near band edge (NBE) emission at 3.40 eV, and a broad yellow line at 2.27 eV. The NBE emission could result from the free electron-hole pair recombination in GaN, considering its low binding energy of about 20 meV, or band to band recombination. The yellow line may be due to the presence of a Ga vacancy and oxygen complex point defect. Strong intensity of the GaN near band edge emission indicates a good optical quality of the GaN/graphene.

The two steps growth, functionalization and low temperature epitaxy, are the keys to the successful growth of GaN on EG. The reaction of TMA molecules with surface fluorine that is semi-ionically bonded to carbon in the top graphene layer results in a substitution of aluminum for fluorine and a creation of reaction sites for subsequent AlN growth as shown in FIG. 2(h).

XPS measurements after 1.2 nm of ALE AlN growth did not detect fluorine, which supports the claim that the functionalized fluorine simply initiated the ALE growth. Because of less strain, heteroepitaxial growth of GaN on ALE AlN/EG resulted in a higher crystalline quality GaN material once the growth condition is optimized. Hence, the optimum properties of both GaN and graphene can be utilized for the device applications such as hot-electron transistors.

As such, GaN on epitaxial graphene/SiC was grown by MOCVD using the enabling techniques of fluorine functionalization graphene followed by a low temperature ALE of an AlN nucleation layer. The graphene 2D Raman peak at 2719 $cm^{-1}$ from GaN/AlN/graphene/SiC stack confirms the grapheme film is preserved after the AlN and GaN subsequent growth. SEM and AFM images show that the GaN is uniform and pinhole free. The XRD peaks show that the GaN is epitaxial and [0001] oriented with the rocking curve FHWM of 544 and 461 arcsec for (0002) and (0004) peaks, respectively. These FWHM values are close to the typical reported values of state-of-the-art GaN grown heteroepitaxially on sapphire. The PL measurement reveals a strong room temperature band edge emission at 3.40 eV. These results support a successful demonstration of electronic quality, heteroepitaxial wurtizic GaN on graphene, which could be a useful heterojunction in a variety of devices.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What we claim is:

1. A method of growing epitaxial GaN or AlN crystalline materials from two-dimensional inert materials consisting of:
    functionalizing a surface of a two-dimensional inert material and creating a functionalized surface;
    wherein the two-dimensional inert material is graphene;
    utilizing Atomic Layer Epitaxy;
    growing a nucleation layer from the functionalized surface;
    wherein the nucleation layer is grown via Atomic Layer Epitaxy; and
    growing a crystalline material from the nucleation layer;
    wherein the crystalline material is a monolayer crystalline epitaxial material;
    wherein the functionalizing a surface of a two-dimensional inert material further comprises pretreating the surface with ex-situ and/or in-situ pretreatment;
    wherein the pretreating the surface with ex-situ pretreatment comprises treating with one selected from the group consisting of $XeF_2$, plasma such as $N_2$, $H_2$, $O_2$, $NH_3$, $NO_x$, and wet chemicals;
    wherein the pretreating the surface with in-situ pretreatment is with a plasma;
    wherein the plasma is one selected from the group consisting of $H_2$, $N_2$, mixture of $N_2$ and $H_2$, and ammonia; and
    wherein the monolayer crystalline material is a III-V compound semiconductor or a II-VI compound semiconductor.

2. An epitaxial GaN or AlN crystalline material grown from a two-dimensional inert material made from the process comprising
    functionalizing a surface of a two-dimensional inert material;
    wherein the two-dimensional inert material is graphene; and
    creating a functionalized surface;
    utilizing Atomic Layer Epitaxy;
    growing a nucleation layer from the functionalized surface;
    wherein the nucleation layer is grown via Atomic Layer Epitaxy; and
    growing a crystalline material from the nucleation layer, wherein the crystalline material is a monolayer crystalline epitaxial material;
    wherein the epitaxial GaN or AlN crystalline material on the inert material is two-dimensional;
    wherein the functionalizing a surface of a two-dimensional inert material further comprises pretreating the surface with ex-situ and/or in-situ pretreatment;
    wherein the pretreating the surface with ex-situ pretreatment comprises treating with one selected from the group consisting of $XeF_2$, plasma such as $N_2$, $H_2$, $O_2$, $NH_3$, $NO_x$, and wet chemicals;
    wherein the pretreating the surface with in-situ pretreatment is with a plasma;
    wherein the plasma is one selected from the group consisting of $H_2$, $N_2$, mixture of $N_2$ and $H_2$, and ammonia; and
    wherein the monolayer crystalline material is a III-V compound semiconductor or a II-VI compound semiconductor.

3. An epitaxial GaN or AlN crystalline material grown from a two-dimensional inert material comprising:
    a functionalized epitaxial graphene layer comprising an aluminum nitride nucleation layer on a silicon carbide substrate wherein the functionalized epitaxial layer was grown using atomic layer epitaxy;
    a gallium nitride film on the aluminum nitride nucleation layer wherein the gallium nitride film was grown by metalorganic chemical vapor deposition;
    wherein the gallium nitride film maintains the surface structure of and a crystalline registration to the silicon carbide substrate after the epitaxial crystalline graphene growth and wherein the structure is two-dimensional and is epitaxial,
    wherein the functionalized epitaxial graphene layer was pretreated with ex-situ and/or in-situ pretreatment;
    wherein the pretreated functionalized epitaxial graphene layer was with one selected from the group consisting of $XeF_2$, plasma such as $N_2$, $H_2$, $O_2$, $NH_3$, $NO_x$, and wet chemicals;
    wherein the pretreated functionalized epitaxial graphene layer was with in-situ pretreatment of a plasma;
    wherein the plasma is one selected from the group consisting of $H_2$, $N_2$, mixture of $N_2$ and $H_2$, and ammonia; and
    wherein the crystalline material is a III-V compound semiconductor or a II-VI compound semiconductor.

4. The epitaxial GaN or AlN crystalline material grown from a two-dimensional inert material of claim 3 wherein Raman measurements show a graphene 2D peak at 2719 $cm^{-1}$ after the gallium nitride growth and X-ray diffraction analysis reveals [0001] oriented hexagonal GaN with a rocking curve full width at half maximum (FWHM) of (0002) and (0004) peaks of 544 and 641 arc-sec, respectively and wherein the GaN film has a room temperature photoluminescence band edge emission at 3.40 eV due to near band edge transition.

* * * * *